(12) United States Patent
Makino

(10) Patent No.: US 11,118,970 B2
(45) Date of Patent: Sep. 14, 2021

(54) OPTICAL DETECTION CIRCUIT COMPRISING AN OPTICAL DETECTOR TO GENERATE VOLTAGE BETWEEN AN ANODE AND A CATHODE DUE TO PHOTOELECTROMOTIVE FORCE GENERATED IN ACCORDANCE WITH INCIDENT LIGHT QUANTITY

(71) Applicant: HAMAMATSU PHOTONICS K.K., Hamamatsu (JP)

(72) Inventor: Kenji Makino, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/647,496

(22) PCT Filed: Sep. 5, 2018

(86) PCT No.: PCT/JP2018/032910
§ 371 (c)(1),
(2) Date: Mar. 14, 2020

(87) PCT Pub. No.: WO2019/102684
PCT Pub. Date: May 31, 2019

(65) Prior Publication Data
US 2020/0271514 A1 Aug. 27, 2020

(30) Foreign Application Priority Data

Nov. 24, 2017 (JP) .............................. JP2017-226192

(51) Int. Cl.
*G01J 1/42* (2006.01)
*G01J 1/46* (2006.01)
(Continued)

(52) U.S. Cl.
CPC .............. *G01J 1/46* (2013.01); *G01J 1/1626* (2013.01); *H01L 31/024* (2013.01);
(Continued)

(58) Field of Classification Search
CPC ............. H01L 31/02024; H01L 31/042; H01L 31/0504; H01L 31/173; H01L 31/167;
(Continued)

(56) References Cited

U.S. PATENT DOCUMENTS 4,442,381 A * 4/1984 Numata ............... H05B 41/325
250/214 L
2006/0091294 A1 5/2006 Frank et al.

FOREIGN PATENT DOCUMENTS

JP S48-074768 A 10/1973
JP S60-020655 A 2/1985
(Continued)

OTHER PUBLICATIONS

English-language translation of International Preliminary Report on Patentability (IPRP) dated Jun. 4, 2020 that issued in WO Patent Application No. PCT/JP2018/032910.

(Continued)

*Primary Examiner* — Que Tan Le
(74) *Attorney, Agent, or Firm* — Faegre Drinker Biddle & Reath LLP

(57) ABSTRACT

An optical detection circuit includes: a first optical detection element having a first anode and a first cathode, the first optical detection element being configured to generate voltage between the first anode and the first cathode due to photoelectromotive force generated in accordance with incident-light quantity; and a first operational amplifier having a first non-inverting input terminal, a first inverting input terminal, and a first output terminal, in which the first non-inverting input terminal is connected to fixed potential,
(Continued)

one of the first anode and the first cathode is connected to the first inverting input terminal, and the other of the first anode and the first cathode is connected to the first output terminal.

11 Claims, 12 Drawing Sheets

(51) Int. Cl.
    *G01J 1/16*     (2006.01)
    *H01L 31/024*     (2014.01)
    *H01L 31/105*     (2006.01)
    *H01L 31/109*     (2006.01)
    *G01J 1/44*     (2006.01)

(52) U.S. Cl.
    CPC .......... *H01L 31/105* (2013.01); *H01L 31/109* (2013.01); *G01J 2001/446* (2013.01)

(58) Field of Classification Search
    CPC ......... H03F 3/08; G01D 5/34; G02F 1/13318; Y02B 10/10; G01J 1/42; G01J 1/46; G01J 1/16
    USPC .......................................... 250/214 R, 214.1
    See application file for complete search history.

(56) References Cited

FOREIGN PATENT DOCUMENTS

| | | |
|---|---|---|
| JP | S61-081677 A | 4/1986 |
| JP | H6-217399 A | 8/1994 |
| JP | H10-281867 A | 10/1998 |
| JP | 2000-183320 A | 6/2000 |
| JP | 2002-134761 A | 5/2002 |
| JP | 2005-216984 A | 8/2005 |
| JP | 2008-270529 A | 11/2008 |
| JP | 2010-506141 A | 2/2010 |
| SU | 1696894 A1 | 12/1991 |
| WO | WO-2007/125873 A1 | 11/2007 |
| WO | WO-2008/044749 A1 | 4/2008 |

OTHER PUBLICATIONS

Hyyppa K et al., "Low-Noise Photodiode-Amplifier Circuits", IEEE Journal of Solid-State Circuits, IEEE, USA, vol. 29, No. 3, Mar. 2, 1994, p. 362-p. 365, XP000452127.

* cited by examiner (a)

(b)

OPTICAL DETECTION CIRCUIT COMPRISING AN OPTICAL DETECTOR TO GENERATE VOLTAGE BETWEEN AN ANODE AND A CATHODE DUE TO PHOTOELECTROMOTIVE FORCE GENERATED IN ACCORDANCE WITH INCIDENT LIGHT QUANTITY

TECHNICAL FIELD

The present disclosure relates to an optical detection circuit.

BACKGROUND ART

An optical detection circuit including a photodiode, has been known (for example, refer to Patent Literature 1 and Patent Literature 2). The photodiode generates the number of electrons and the number of holes corresponding to the quantity of incident light (incident-light quantity), in a PN junction formed of a P-type semiconductor and an N-type semiconductor. For example, in the optical detection circuit described in Patent Literature 1, an anode of the photodiode is connected to an inverting input terminal of an operational amplifier. A feedback resistor and a feedback capacitor provided in parallel, are connected between the inverting input terminal and the output terminal of the operational amplifier. When incident light enters the photodiode, photocurrent corresponding to the incident-light quantity is input into an amplifier circuit (transimpedance amplifier) formed of the operational amplifier, the feedback resistor, and the feedback capacitor. Then, the photocurrent is amplified for output as a voltage signal.

CITATION LIST

Patent Literature

Patent Literature 1: Japanese Unexamined Patent Publication No. 2002-134761
Patent Literature 2: Japanese Unexamined Patent Publication No. 2005-216984

SUMMARY OF INVENTION

Technical Problem

For example, in a case where the photodiode used in the optical detection circuit described above has optical sensitivity at which the photocurrent generated per incident-light quantity of 1 W is several milliamperes, the feedback resistor having a large resistance value that is approximately several megaohms, needs to be provided for acquisition of an appropriate voltage signal corresponding to the incident-light quantity. Thus, the time constant of the transimpedance amplifier increases, so that a long time is likely to be taken until the optical detection circuit outputs the voltage signal (output voltage) corresponding to the incident-light quantity after the incident light enters the photodiode.

The present disclosure describes an optical detection circuit enabling the response time from entry of the incident light until output of an output voltage corresponding to incident-light quantity to be shortened.

Solution to Problem

An optical detection circuit according to one aspect of the present disclosure, includes: a first optical detection element having a first anode and a first cathode, the first optical detection element being configured to generate voltage between the first anode and the first cathode due to photoelectromotive force generated in accordance with incident-light quantity; and a first operational amplifier having a first non-inverting input terminal, a first inverting input terminal, and a first output terminal. The first non-inverting input terminal is connected to fixed potential. One of the first anode and the first cathode is connected to the first inverting input terminal, and the other of the first anode and the first cathode is connected to the first output terminal.

In the optical detection circuit, the first non-inverting input terminal of the first operational amplifier is connected to the fixed potential. One of the first anode and the first cathode of the first optical detection element is connected to the first inverting input terminal of the first operational amplifier, and the other of the first anode and the first cathode of the first optical detection element is connected to the first output terminal of the first operational amplifier. For example, in a case where photocurrent generated in the first optical detection element in accordance with the incident-light quantity, flows in a parallel resistive component included inside the first optical detection element, the voltage corresponding to the incident-light quantity is generated between the first anode and the first cathode. Because the potential of the first inverting input terminal is substantially equal to the fixed potential, output voltage at the first output terminal has the value based on the voltage generated between the first anode and the first cathode. Therefore, the voltage generated in the first optical detection element in accordance with the incident-light quantity, results in being directly the output voltage to be output from the first operational amplifier. Thus, it becomes possible to shorten the response time from entry of the incident light until output of the output voltage corresponding to the incident-light quantity.

The optical detection circuit may further include an amplifier circuit configured to amplify output voltage occurring at the first output terminal.

In this case, the output voltage at the first output terminal is amplified by the amplifier circuit. Therefore, the incident-light quantity can be detected on the basis of output voltage acquired by amplifying the voltage generated between the first anode and the first cathode of the first optical detection element.

The amplifier circuit may have a second operational amplifier, a first resistive element, and a second resistive element. The second operational amplifier may have a second non-inverting input terminal, a second inverting input terminal, and a second output terminal. One end of the first resistive element may be connected to the second inverting input terminal, and another end of the first resistive element may be connected to the first output terminal. One end of the second resistive element may be connected to the second inverting input terminal, and another end of the second resistive element may be connected to the second output terminal. The second non-inverting input terminal may be connected to fixed potential.

In this case, the output voltage at the first output terminal can be amplified by the amplification factor acquired by dividing the resistance value of the second resistive element by the resistance value of the first resistive element.

The first resistive element may be a second optical detection element having a second anode and a second cathode. The second optical detection element may generate voltage between the second anode and the second cathode due to photoelectromotive force generated in accordance with incident-light quantity.

The voltage generated between the first anode and the first cathode of the first optical detection element has a value substantially proportional to the resistance value of the parallel resistive component included in the first optical detection element. The amplification factor of the amplifier circuit is determined on the basis of the resistance value of a parallel resistive component included in the second optical detection element. According to the above configuration, for example, as the ambient temperature of the optical detection circuit rises, the resistance value of the parallel resistive component included in the first optical detection element decreases, resulting in decrease of the output voltage at the first output terminal. Meanwhile, as the ambient temperature of the optical detection circuit rises, the resistance value of the parallel resistive component included in the second optical detection element decreases, resulting in increase of the amplification factor of the amplifier circuit. Thus, even when the output voltage at the first output terminal decreases on the basis of the ambient temperature, the amplification factor of the amplifier circuit increases. Even when the output voltage at the first output terminal increases on the basis of the ambient temperature, the amplification factor of the amplifier circuit decreases. Therefore, the variation of the output voltage at the second output terminal based on the ambient temperature, can be reduced.

The second optical detection element may be formed on a chip on which the first optical detection element is formed.

In this case, the temperature characteristic of the parallel resistive component in the first optical detection element is substantially the same as the temperature characteristic of the parallel resistive component in the second optical detection element. Thus, the variation of the output voltage at the second output terminal based on the ambient temperature, can be further reduced.

The first optical detection element may include a single first photodiode or a plurality of first photodiodes connected in series. The second optical detection element may include a single second photodiode or a plurality of second photodiodes connected in series.

In this case, because the number of holes and the number of electrons corresponding to the incident-light quantity are generated in the layer of a P-type semiconductor and the layer of an N-type semiconductor in the first photodiode, the output voltage corresponding to the incident-light quantity can be detected.

The number of second photodiodes may be smaller than the number of first photodiodes.

The output voltage at the first output terminal is substantially proportional to the value acquired by multiplying the resistance value of the parallel resistive component of the first photodiode and the number of first photodiodes together. For example, in a case where the amplifier circuit is an inverting amplifier circuit, the amplification factor is substantially inversely proportional to the value acquired by multiplying the resistance value of the parallel resistive component of the second photodiode and the number of second photodiodes together. Thus, according to the above configuration, the output voltage at the second output terminal is substantially proportional to the value acquired by dividing the number of first photodiodes by the number of second photodiodes. Accordingly, decreasing the number of second photodiodes below the number of first photodiodes, enables output of the output voltage having a high voltage value at the second output terminal, with reduction of the variation of the output voltage at the second output terminal based on the ambient temperature.

The first anode may be connected to the first inverting input terminal, and the first cathode may be connected to the first output terminal.

In this case, because the voltage generated between the first anode and the first cathode results in being the output voltage at the first output terminal, it becomes possible to shorten the response time from entry of the incident light until output of the output voltage corresponding to the incident-light quantity.

The first cathode may be connected to the first inverting input terminal, and the first anode may be connected to the first output terminal.

In this case, because the voltage generated between the first anode and the first cathode results in being the output voltage at the first output terminal, it becomes possible to shorten the response time from entry of the incident light until output of the output voltage corresponding to the incident-light quantity.

The optical detection circuit may further include a capacitive element. One end of the capacitive element may be connected to the first anode, and another end of the capacitive element may be connected to the first cathode.

In this case, the operation of the first operational amplifier can be stabilized with the capacitive element. A low-pass filter formed of the parallel resistive component included in the first optical detection element and the capacitive element, can eliminate a high-frequency component included in the output voltage at the first output terminal.

The optical detection circuit may further include a third resistive element. One end of the third resistive element may be connected to the first anode, and another end of the third resistive element may be connected to the first cathode.

In this case, the influence of the ambient temperature to the gain of the first operational amplifier, can be reduced with the third resistive element.

Advantageous Effects of Invention

According to the present disclosure, the response time until output of the output voltage corresponding to the incident-light quantity after entry of the incident light, can be shortened.

DESCRIPTION OF EMBODIMENTS

Respective optical detection circuits according to embodiments will be described below with reference to the drawings. The same or equivalent parts in the figures are denoted with the same reference signs, and thus the duplicate descriptions thereof will be omitted. Note that, in the following description, "connection" means electrical connection unless otherwise noted. For example, an aspect in which one element is connected to another element, may include that one element is connected to another element through any circuit element, such as a resistive element.

Figure 1:
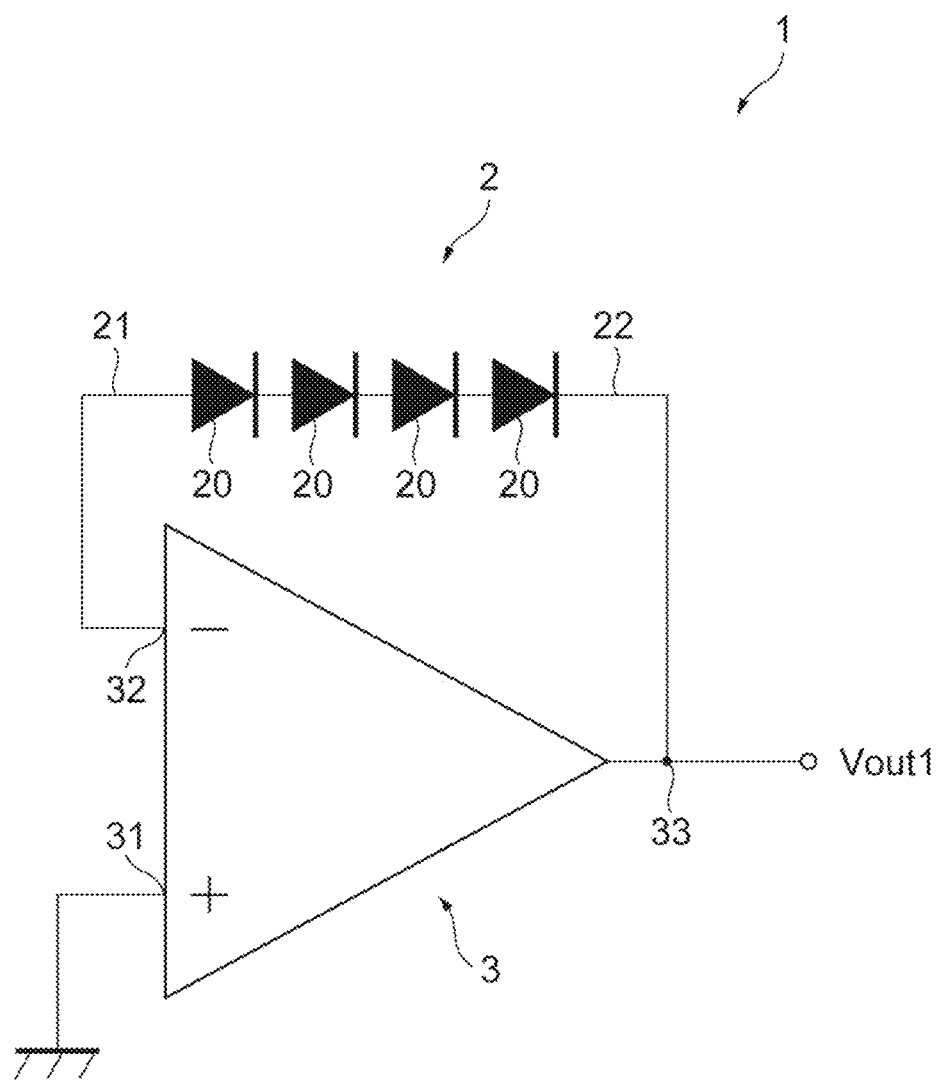
FIG. 1 is a diagram illustrating the configuration of an optical detection circuit according to a first embodiment.

FIG. 1 is a diagram illustrating the configuration of an optical detection circuit according to a first embodiment. An optical detection circuit 1 illustrated in FIG. 1 is a circuit for detecting incident-light quantity. Specifically, the optical detection circuit 1 generates output voltage Vout1 corresponding to the incident-light quantity, and outputs the output voltage Vout1 to the outside of the optical detection circuit 1. The optical detection circuit 1 includes an optical detection element 2 (first optical detection element) and an operational amplifier 3 (first operational amplifier).

The optical detection element 2 is a photoelectric conversion element that generates an electric signal corresponding to the incident-light quantity. The optical detection element 2 includes a plurality of photodiodes 20 (plurality of first photodiodes) connected in series. Each photodiode 20 is a PN photodiode having a PN junction formed of a P-type semiconductor and an N-type semiconductor. The photodiode 20 is, for example, an InAsSb photodiode. The InAsSb photodiode has a semi-insulating substrate and a PN junction provided on the semi-insulating substrate. The PN junction is formed with indium arsenide antimonide (InAsSb), which is a compound semiconductor. The semi-insulating substrate is, for example, formed with gallium arsenide (GaAs), which is a compound semiconductor. For example, the InAsSb photodiode is suitable for detection of infrared rays having wavelengths in the vicinity of from 3 to 5 μm. Note that the optical detection element 2 is also referred to as a photovoltaic element.

Each photodiode 20 has an anode (positive electrode) connected to the P-type semiconductor in the PN junction and a cathode (negative electrode) connected to the N-type semiconductor in the PN junction. In the PN junction of each photodiode 20, the number of electrons and the number of holes (carriers) substantially proportional to the incident-light quantity are generated. As a result, photoelectromotive force is generated between the layer of the P-type semiconductor and the layer of the N-type semiconductor in the PN junction of each photodiode 20. Thus, electrical connection is made between the anode and the cathode of the photo-diode 20, resulting in a flow of photocurrent Ip having an amount of current corresponding to the incident-light quantity.

Figure 2:
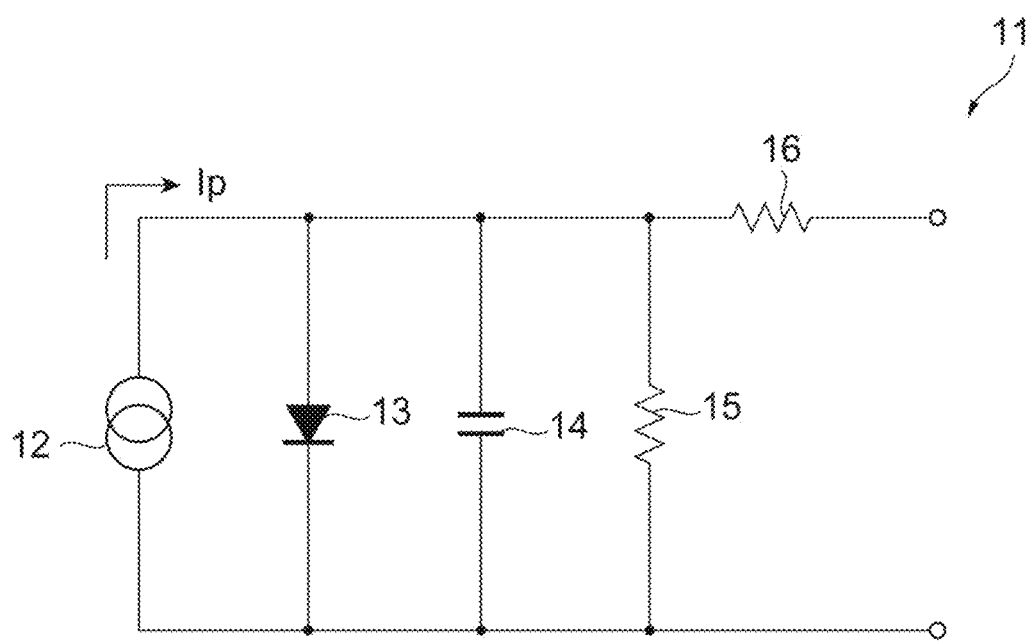
FIG. 2 is a diagram illustrating an equivalent circuit for a photodiode.

FIG. 2 is a diagram illustrating an equivalent circuit for a photodiode. As illustrated in FIG. 2, each photodiode 20 may be expressed by an equivalent circuit (equivalent circuit) 11 including a current source 12, a diode 13, a capacitive component 14, a parallel resistive component (shunt resistor) 15, and a series resistive component 16. The current source 12 flows the photocurrent Ip having an amount of current substantially proportional to the incident-light quantity. The diode 13 is connected in parallel to the current source 12. The capacitive component 14 is connected in parallel to the current source 12. The parallel resistive component 15 having a resistance value Rsh0, is connected in parallel to the current source 12. The series resistive component 16 is connected in series to the current source 12. The parallel resistive component 15 of each photodiode 20 is a resistive component due to leakage current in the PN junction. The resistance value Rsh0 of the parallel resistive component 15 depends on the level of a band gap in the PN junction. As the band gap widens in the PN junction, the resistance value Rsh0 increases. As the band gap narrows in the PN junction, the resistance value Rsh0 decreases.

Although four photodiodes 20 are illustrated in FIG. 1, for example, the optical detection circuit 1 has the optical detection element 2 including 200 photodiodes 20 connected in series. In the optical detection element 2, the plurality of photodiodes 20 is connected in series such that the anode of one of mutually adjacent two photodiodes 20 is connected to the cathode of the other. The anode of the photodiode 20 disposed at one end in the optical detection element 2 is not connected to the cathode of any other photodiode 20, and forms an anode 21 for the optical detection element 2. The cathode of the photodiode 20 disposed at the other end in the optical detection element 2 is not connected to the anode of any other photodiode 20, and forms a cathode 22 for the optical detection element 2. That is, the optical detection element 2 has the anode 21 (first anode) and the cathode 22 (first cathode).

The optical detection element 2 including the plurality of photodiodes 20 connected in series, may be expressed by an equivalent circuit similar to that of each photodiode 20. In a case where the band gap of each photodiode 20 is narrow, most of the photocurrent Ip flows in the parallel resistive component 15. Thus, a resistance value Rsh1 of a parallel resistive component included in the optical detection element 2 is substantially equal to the value acquired by multiplying the resistance value Rsh0 by the number of photodiodes 20. The resistance value Rsh1 is the resistance value between the anode 21 and the cathode 22. Note that, because the resistance value of the series resistive component 16 is considerably smaller than the resistance value Rsh0, the influence of the series resistive component 16 is negligible.

The operational amplifier 3 is an operational amplifier having a non-inverting input terminal 31 (first non-inverting input terminal), an inverting input terminal 32 (first inverting input terminal), and an output terminal 33 (first output terminal). The non-inverting input terminal 31 is connected to ground potential (fixed potential). The anode 21 is connected to the inverting input terminal 32. The cathode 22 is connected to the output terminal 33. The optical detection circuit 1 outputs the output voltage Vout1 at the output terminal 33, as a detected result, to the outside of the optical detection circuit 1. Note that the non-inverting input terminal 31 may be connected to fixed potential different from the ground potential. In this case, the fixed potential may have either a positive constant value or a negative constant value.

In the optical detection circuit 1 having the configuration described above, the number of electrons and the number of holes substantially proportional to the incident-light quantity are generated in the optical detection element 2 by incident light entering the optical detection element 2. In a case where each photodiode 20 is an InAsSb photodiode, because the band gap of the InAsSb photodiode is narrow, the resistance value Rsh1 is small. For example, in a case where 200 to 300 InAsSb photodiodes are connected in series, the resistance value Rsh1 is several hundred kiloohms Because current allowed to be input to the inverting input terminal 32 of the operational amplifier 3 is considerably small, the photocurrent Ip cannot flow from the anode 21 to the outside of the optical detection element 2. Thus, substantially all the photocurrent Ip generated in the optical detection element 2 flows in the parallel resistive component included in the optical detection element 2. As a result, voltage substantially equal to the value acquired by multiplying the resistance value Rsh1 and the photocurrent Ip together, is generated between the anode 21 and the cathode 22 of the optical detection element 2. The voltage generated between the anode 21 and the cathode 22, is the potential difference between the potential of the anode 21 and the potential of the cathode 22.

The non-inverting input terminal 31 connected to the ground potential, and the potential of the inverting input terminal 32 is substantially the same as the potential of the non-inverting input terminal 31. Thus, the potential of the inverting input terminal 32 is substantially 0 V. Thus, the output voltage Vout1 at the output terminal 33 is regarded as the voltage generated between the anode 21 and the cathode 22. Therefore, the output voltage Vout1 has a value corresponding to the incident-light quantity, so that the incident-light quantity can be detected by measuring the output voltage Vout1. Note that, in a case where the non-inverting input terminal 31 is connected to fixed potential different from the ground potential, the output voltage Vout1 at the output terminal 33 has the value acquired by adding the fixed potential to the voltage generated between the anode 21 and the cathode 22.

Figure 3:
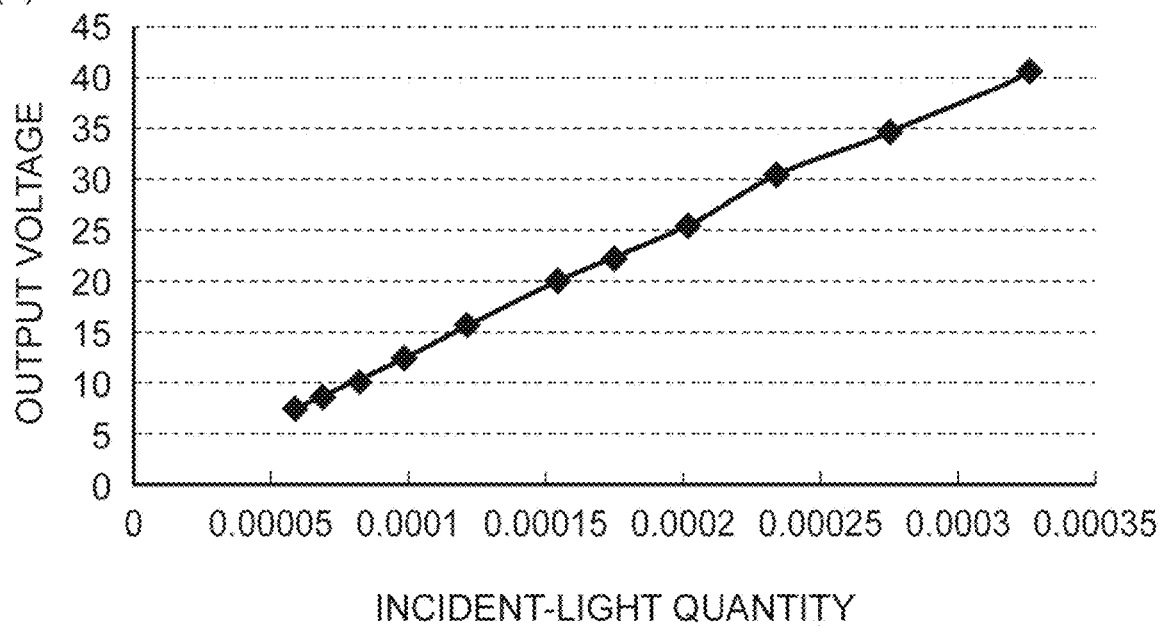
FIG. 3(a) is a graph illustrating an exemplary relationship between incident-light quantity and output voltage in the optical detection circuit illustrated in FIG. 1.
FIG. 3(b) is a graph illustrating an exemplary relationship between incident-light quantity and output voltage in a comparative exemplary optical detection circuit.
Figure 3:
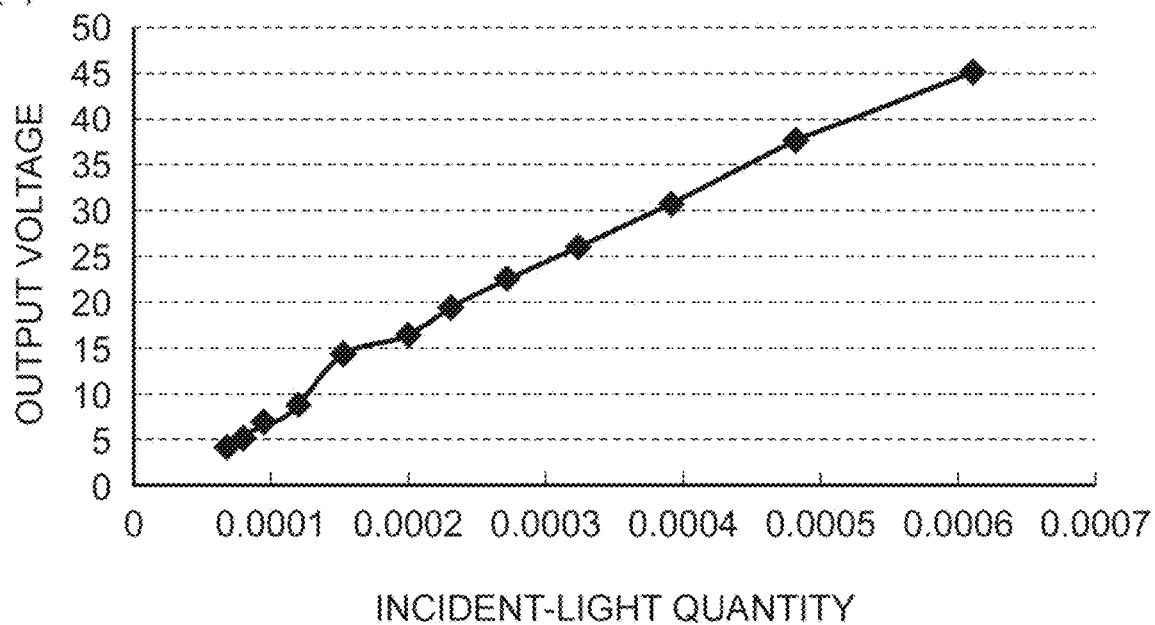

Next, the relationship between incident-light quantity and output voltage will be described with FIGS. 3(a) and 3(b). FIG. 3(a) is a graph illustrating an exemplary relationship between incident-light quantity and output voltage in the optical detection circuit illustrated in FIG. 1. In FIG. 3(a), the horizontal axis indicates the incident-light quantity, and the unit thereof is an arbitrary unit. The vertical axis indicates the output voltage Vout1, and the unit thereof is millivolt (mV). FIG. 3(b) is a graph illustrating an exemplary relationship between incident-light quantity and output voltage in a comparative exemplary optical detection circuit. In the comparative exemplary optical detection circuit, a transimpedance amplifier converts photocurrent output from a photodiode, into output voltage. In the transimpedance amplifier, the cathode of an optical detection element is connected to ground potential and the anode of the optical detection element is connected to the inverting input terminal of an operational amplifier. A feedback capacitor and a feedback resistor mutually connected in parallel have one end connected to the inverting input terminal of the operational amplifier and the other end connected to the output terminal of the operational amplifier. In FIG. 3(b), the horizontal axis indicates the incident-light quantity, and the unit thereof is an arbitrary unit. The vertical axis indicates the output voltage, and the unit thereof is millivolt (mV).

As illustrated in FIG. 3(a), as the incident-light quantity increases, the output voltage Vout1 increases. The output voltage Vout1 is substantially proportional to the incident-light quantity, similarly to the comparative exemplary optical detection circuit in FIG. 3(b). Thus, the incident-light quantity and the output voltage Vout1 are in a linear relationship. Note that the output voltage Vout1 is detected on the basis of the voltage generated between the anode 21 and the cathode 22, in the optical detection circuit 1. Thus, the optical detection circuit 1 is referred to as a voltage reading type (voltage mode). Meanwhile, the comparative exemplary optical detection circuit operates such that the potential difference between the anode and the cathode of the optical detection element does not change. Thus, the photocurrent flows from the anode to the transimpedance amplifier. Thus, the output voltage is detected on the basis of the current flowing from the anode of the optical detection element to the feedback resistor, in the comparative exemplary optical detection circuit. Thus, the comparative exemplary optical detection circuit is referred to as a current reading type (current mode).

In the optical detection circuit 1, the photocurrent Ip substantially proportional to the incident-light quantity, generated in the optical detection element 2, flows in the parallel resistive component included inside the optical detection element 2. Thus, the voltage corresponding to the incident-light quantity, is generated between the anode 21 and the cathode 22. Because the potential of the inverting input terminal 32 is substantially equal to the ground potential, the voltage generated between the anode 21 and the cathode 22 is the output voltage Vout1 generated at the output terminal 33. As above, the voltage corresponding to the incident-light quantity, generated in the optical detection element 2, results in being directly the output voltage Vout1 to be output from the operational amplifier 3. Thus, it becomes possible to shorten the response time from entry of the incident light into the optical detection element 2 until output of the output voltage Vout1 corresponding to the incident-light quantity.

For an optical detection circuit including a feedback resistor and a feedback capacitor connected in parallel, provided between the inverting input terminal 32 and the output terminal 33 of the operational amplifier 3, the response time of the optical detection circuit is affected by the time constant of the transimpedance amplifier that converts the photocurrent Ip into a voltage signal. In contrast to this, in the optical detection circuit 1, only the optical detection element 2 is provided between the inverting input terminal 32 and the output terminal 33. Thus, the response time from entry of the incident light into the optical detection element 2 until output of the output voltage Vout1 corresponding to the incident-light quantity is determined by the response time of the optical detection element 2 or the response time of the operational amplifier 3, whichever is slower.

It is considered that a buffer circuit (voltage follower) that performs impedance conversion is used as an optical detection circuit that detects output voltage corresponding to incident-light quantity. Specifically, in the buffer circuit, the cathode 22 is connected to ground potential, the anode 21 is connected to the non-inverting input terminal of an operational amplifier, and a short circuit occurs between the inverting input terminal and the output terminal of the operational amplifier. However, in the buffer circuit, no fixed voltage having a constant value is input into both the inverting input terminal and the non-inverting input terminal. Thus, the operation of the operational amplifier is likely to be unstable due to noise input in the operational amplifier or noise occurring in the operational amplifier. In contrast to this, because the non-inverting input terminal 31 is connected to the ground potential in the optical detection circuit 1, the operation of the operational amplifier 3 can be improved in stability.

Figure 4:
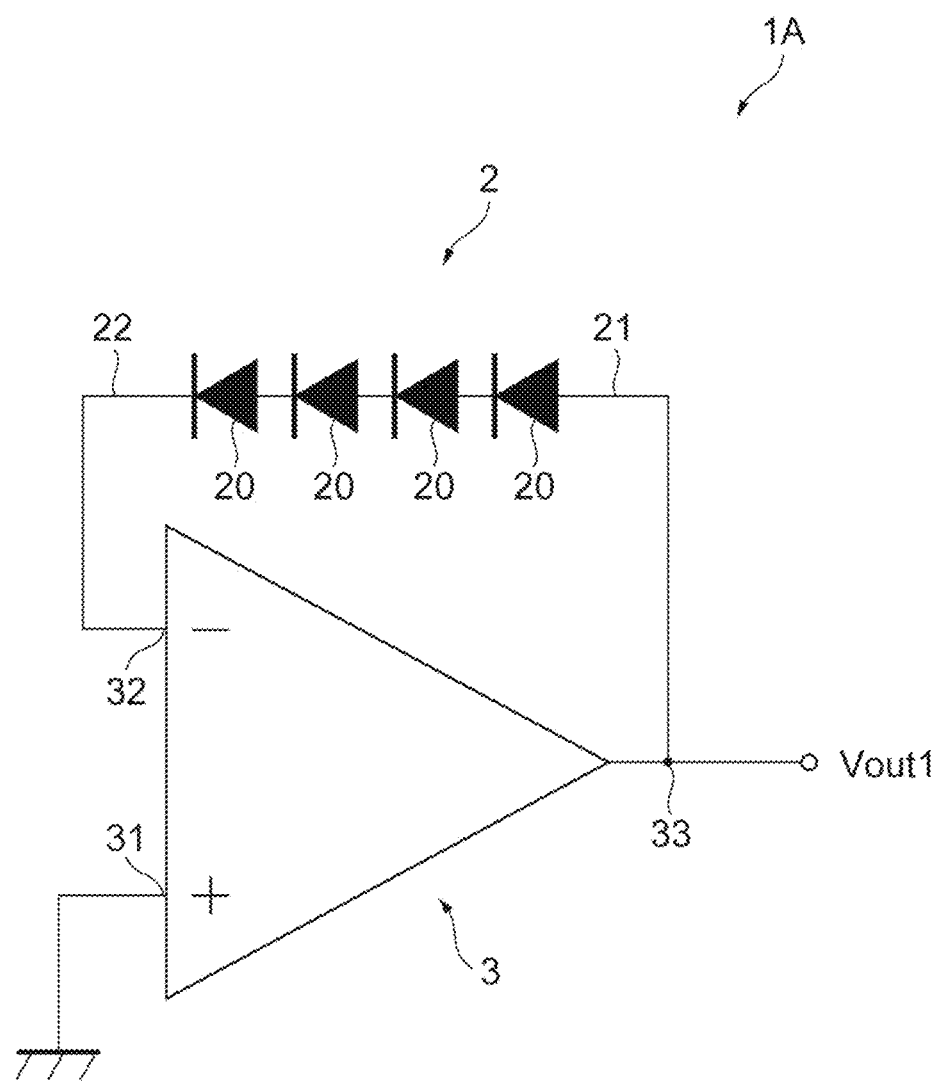
FIG. 4 is a diagram illustrating a first modification of the optical detection circuit according to the first embodiment.

FIG. 4 is a diagram illustrating a first modification of the optical detection circuit according to the first embodiment. An optical detection circuit 1A illustrated in FIG. 4 is different from the optical detection circuit 1 illustrated in FIG. 1 in terms of the connection arrangement of the optical detection element 2. Specifically, the anode 21 is connected to the output terminal 33, and the cathode 22 is connected to the inverting input terminal 32.

The optical detection circuit 1A has an effect similar to that of the optical detection circuit 1. The output voltage Vout1 in the optical detection circuit 1A is opposite in polarity (positive or negative) to but the same in voltage value (absolute value) of the output voltage Vout1 as the output voltage Vout1 in the optical detection circuit 1. That is, although the output voltage Vout1 in the optical detection circuit 1A is opposite in polarity to the output voltage Vout1 in the optical detection circuit 1, the voltage generated between the anode 21 and the cathode 22 results in being the output voltage Vout1 at the output terminal 33, similarly to the optical detection circuit 1. As above, for the optical detection circuits 1 and 1A, one of the anode 21 and the cathode 22 is connected to the inverting input terminal 32, and the other of the anode 21 and the cathode 22 is connected to the output terminal 33.

Figure 5:
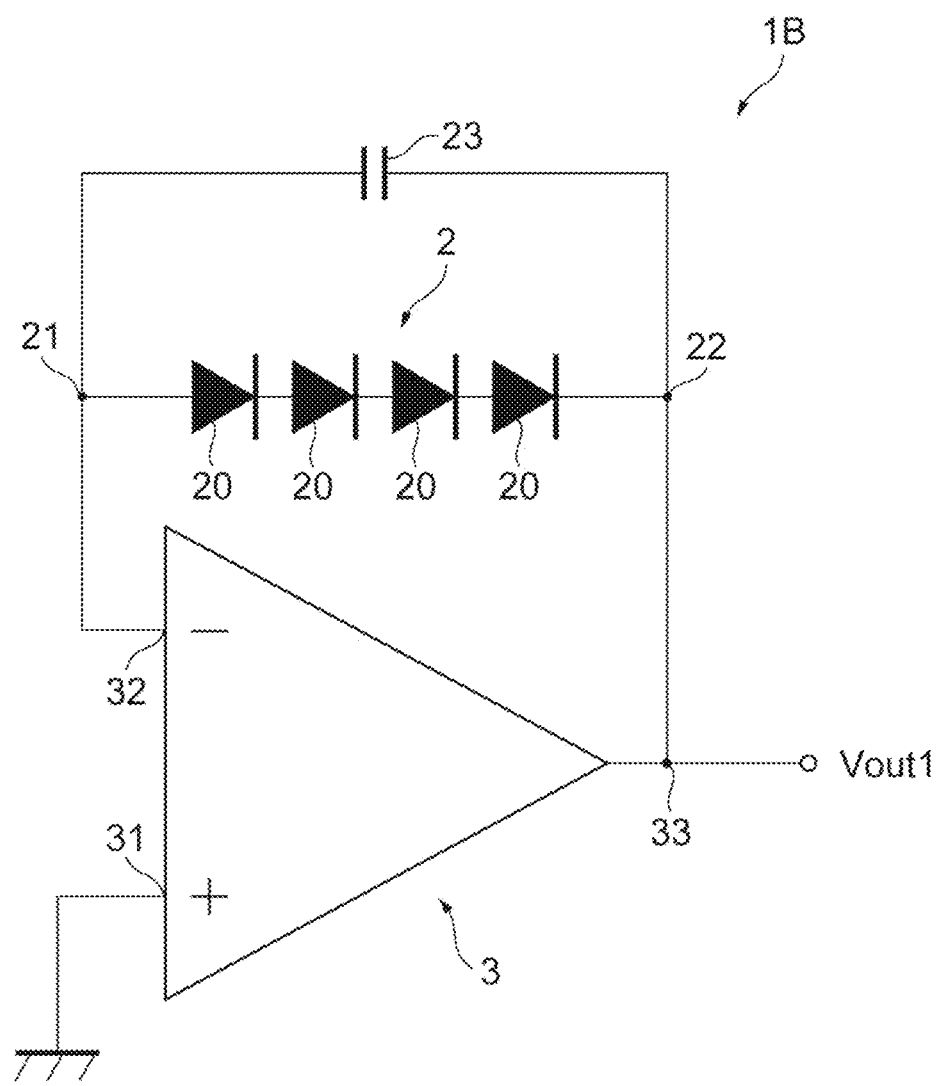
FIG. 5 is a diagram illustrating a second modification of the optical detection circuit according to the first embodiment.

FIG. 5 is a diagram illustrating a second modification of the optical detection circuit according to the first embodiment. An optical detection circuit 1B illustrated in FIG. 5 is different from the optical detection circuit 1 illustrated in FIG. 1 in that a capacitive element (capacitor) 23 is further provided. The capacitive element 23 is connected in parallel to the optical detection element 2. One end of the capacitive element 23 is connected to the anode 21 (inverting input terminal 32), and the other end of the capacitive element 23 is connected to the cathode 22 (output terminal 33).

The optical detection circuit 1B has an effect similar to that of the optical detection circuit 1. In the optical detection circuit 1B, in a case where phase margin is small, the capacitive element 23 can inhibit the operational amplifier 3 from oscillating, so that the operation of the operational amplifier 3 is stable. A low-pass filter formed of the parallel resistive component included in the optical detection element 2 and the capacitive element 23, eliminates a high-frequency component included in the output voltage Vout1 in the optical detection circuit 1B. Note that, in the second modification, the cathode 22 may be connected to the inverting input terminal 32, and the anode 21 may be connected to the output terminal 33, similarly to the first modification.

Figure 6:
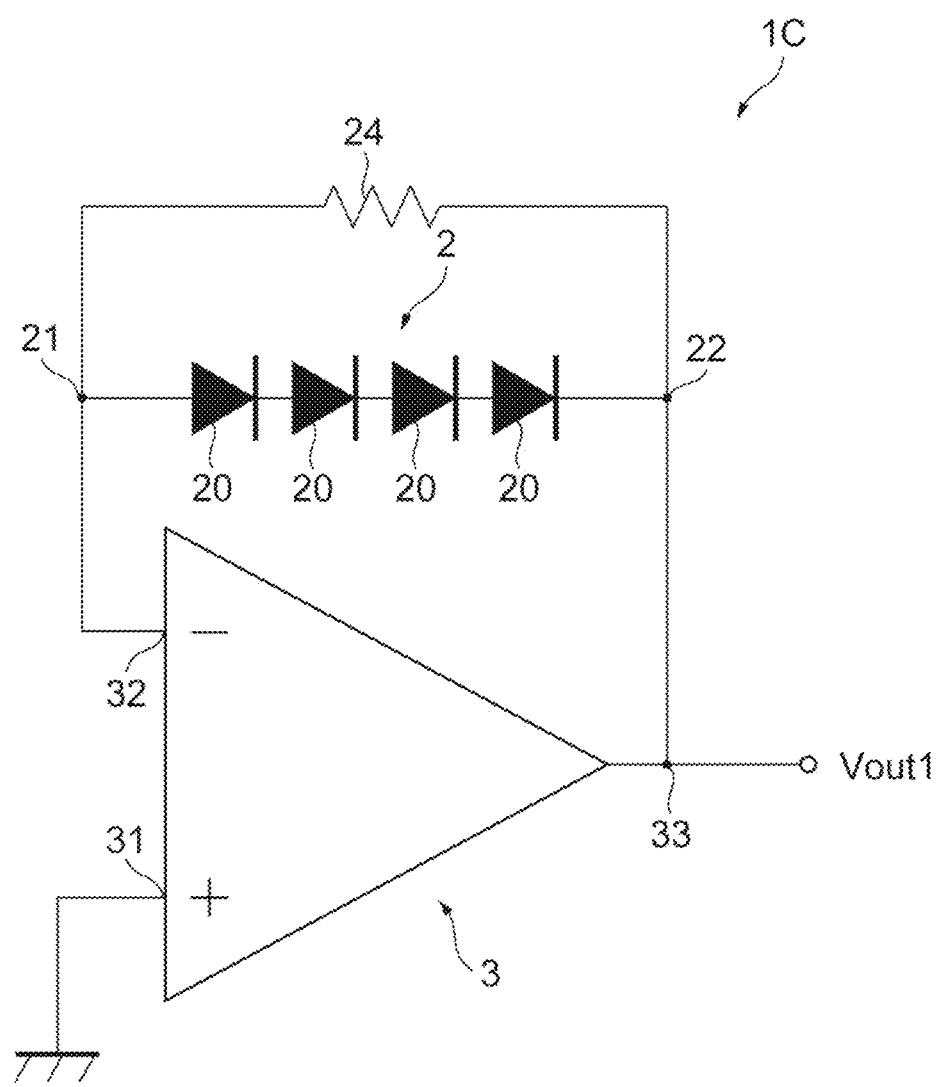
FIG. 6 is a diagram illustrating a third modification of the optical detection circuit according to the first embodiment.

FIG. 6 is a diagram illustrating a third modification of the optical detection circuit according to the first embodiment. An optical detection circuit 1C illustrated in FIG. 6 is different from the optical detection circuit 1 illustrated in FIG. 1 in that a resistive element 24 (third resistive element) is further provided. The resistive element 24 is connected in parallel to the optical detection element 2. One end of the resistive element 24 is connected to the anode 21 (inverting input terminal 32), and the other end of the resistive element 24 is connected to the cathode 22 (output terminal 33).

The optical detection circuit 1C has an effect similar to that of the optical detection circuit 1. In the optical detection circuit 1C, in a case where variation is small in the characteristic of the resistive element 24 based on the ambient temperature, the variation based on the ambient temperature, of the resistance value of combined resistance formed of the resistive element 24 and the parallel resistive component of the optical detection element 2 connected in parallel, is smaller than the variation of the resistance value Rsh1 of only the parallel resistive component of the optical detection element 2. Thus, the influence of the ambient temperature to the output voltage Vout1 is reduced with the resistive element 24. Note that, in the third modification, the cathode 22 may be connected to the inverting input terminal 32, and the anode 21 may be connected to the output terminal 33, similarly to the first modification. The second modification may be applied to the optical detection circuit 1C according to the third modification. That is, one end of the capacitive element 23 and the resistive element 24 mutually connected in parallel, may be connected to the anode 21 (inverting input terminal 32) and the other end may be connected to the cathode 22 (output terminal 33).

Figure 7:
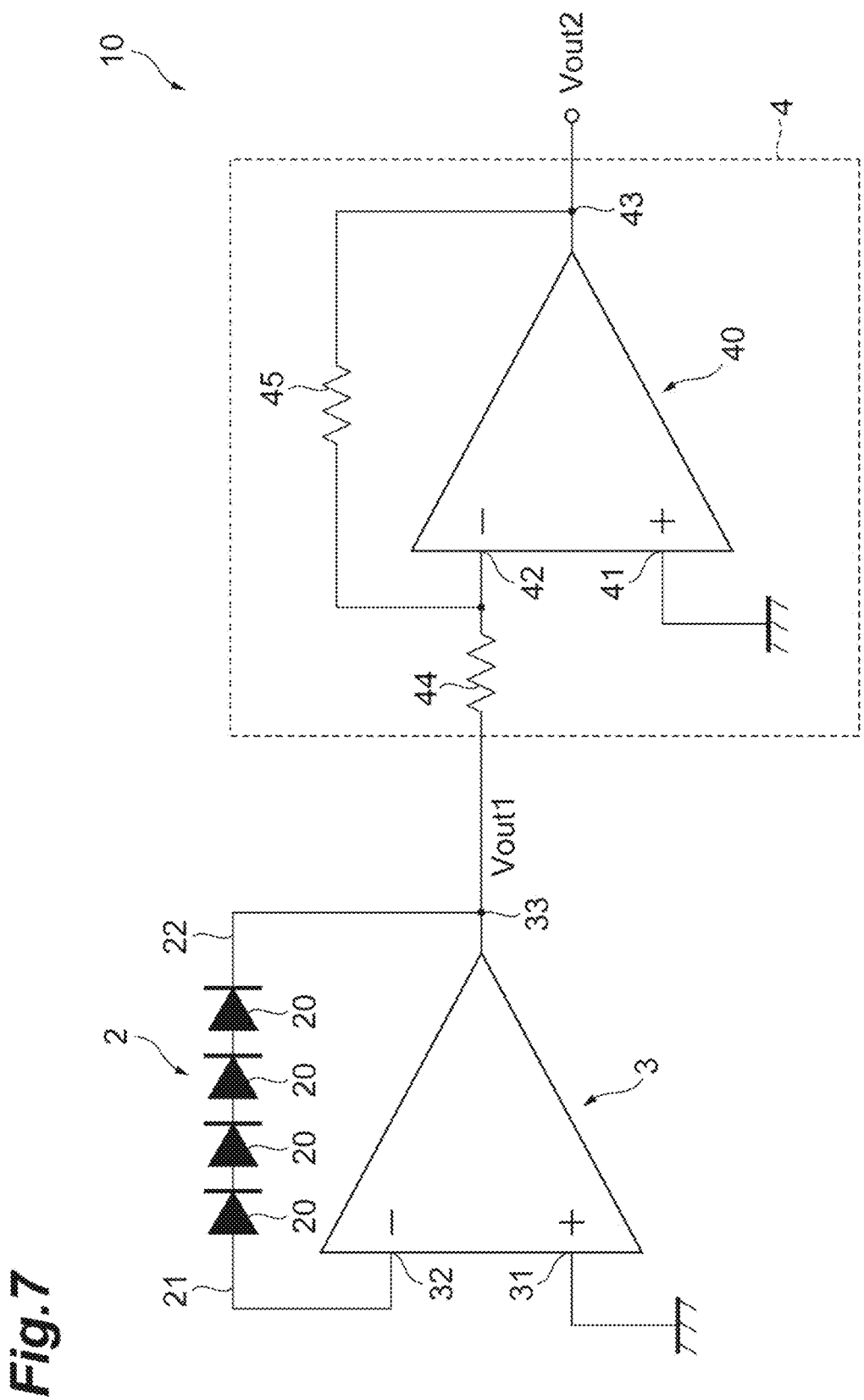
FIG. 7 is a diagram illustrating the configuration of an optical detection circuit according to a second embodiment.

Next, an optical detection circuit according to a second embodiment will be described with FIG. 7. FIG. 7 is a diagram illustrating the configuration of the optical detection circuit according to the second embodiment. As illustrated in FIG. 7, an optical detection circuit 10 according to the second embodiment is different from the optical detection circuit 1 according to the first embodiment in that an inverting amplifier circuit 4 (amplifier circuit) is further provided. The inverting amplifier circuit 4 is a circuit that inversely amplifies the output voltage Vout1. The inverting amplifier circuit 4 includes an operational amplifier 40 (second operational amplifier), a resistive element 44 (first resistive element) having a resistance value R1, and a resistive element 45 (second resistive element) having a resistance value R2.

The operational amplifier 40 has a non-inverting input terminal 41 (second non-inverting input terminal), an inverting input terminal 42 (second inverting input terminal), and an output terminal 43 (second output terminal). The output terminal 33 of the operational amplifier 3 is connected to the inverting input terminal 42 of the operational amplifier 40 through the resistive element 44. Specifically, one end of the resistive element 44 is connected to the inverting input terminal 42, and the other end of the resistive element 44 is connected to the output terminal 33. Therefore, the output voltage Vout1 is input into the inverting amplifier circuit 4. One end of the resistive element 45 is connected to the inverting input terminal 42 (one end of the resistive element 44), and the other end of the resistive element 45 is connected to the output terminal 43. The non-inverting input terminal 41 is connected to ground potential (fixed potential). Note that the non-inverting input terminal 41 may be connected to fixed potential different from the ground potential. In this case, the fixed potential may have either a positive constant value or a negative constant value. The fixed potential connected to the non-inverting input terminal 41, may be different from or may be the same as the fixed potential connected to the non-inverting input terminal 31 of the operational amplifier 3.

Because the amplification factor of the inverting amplifier circuit 4 is the ratio of the resistance value R2 to the resistance value R1 (R2/R1), the inverting amplifier circuit 4 generates output voltage Vout2 by amplifying the output voltage Vout1−(R2/R1) times. For example, for acquisition of the output voltage Vout2 that is the output voltage Vout1 amplified −100 times, the resistance value R1 and the resistance value R2 are set such that an amplification factor of 100 is acquired. The optical detection circuit 10 outputs the output voltage Vout2 as a detected result to the outside of the optical detection circuit 10.

In the optical detection circuit 10 having the configuration described above, the output voltage Vout1 is amplified by the inverting amplifier circuit 4. Therefore, the incident-light quantity can be detected on the basis of the output voltage Vout2 acquired by amplifying the voltage generated between the anode 21 and the cathode 22.

The optical detection circuit 10 may include a non-inverting amplifier circuit (amplifier circuit) not illustrated, instead of the inverting amplifier circuit 4. The non-inverting amplifier circuit includes the operational amplifier 40, the resistive element 44, and the resistive element 45, similarly to the inverting amplifier circuit 4. The output terminal 33 of the operational amplifier 3 is connected to the non-inverting input terminal 41 of the operational amplifier 40. One end of the resistive element 44 is connected to the inverting input terminal 42, and the other end of the resistive element 44 is connected to ground potential. One end of the resistive element 45 is connected to the inverting input terminal 42 (one end of the resistive element 44), and the other end of the resistive element 45 is connected to the output terminal 43. The non-inverting amplifier circuit generates the output voltage Vout2 by amplifying the output voltage Vout1 (1+R2/R1) times. Note that the first, second, or third modification of the first embodiment or any combination thereof may be applied to the optical detection circuit 10 according to the second embodiment.

Figure 8:
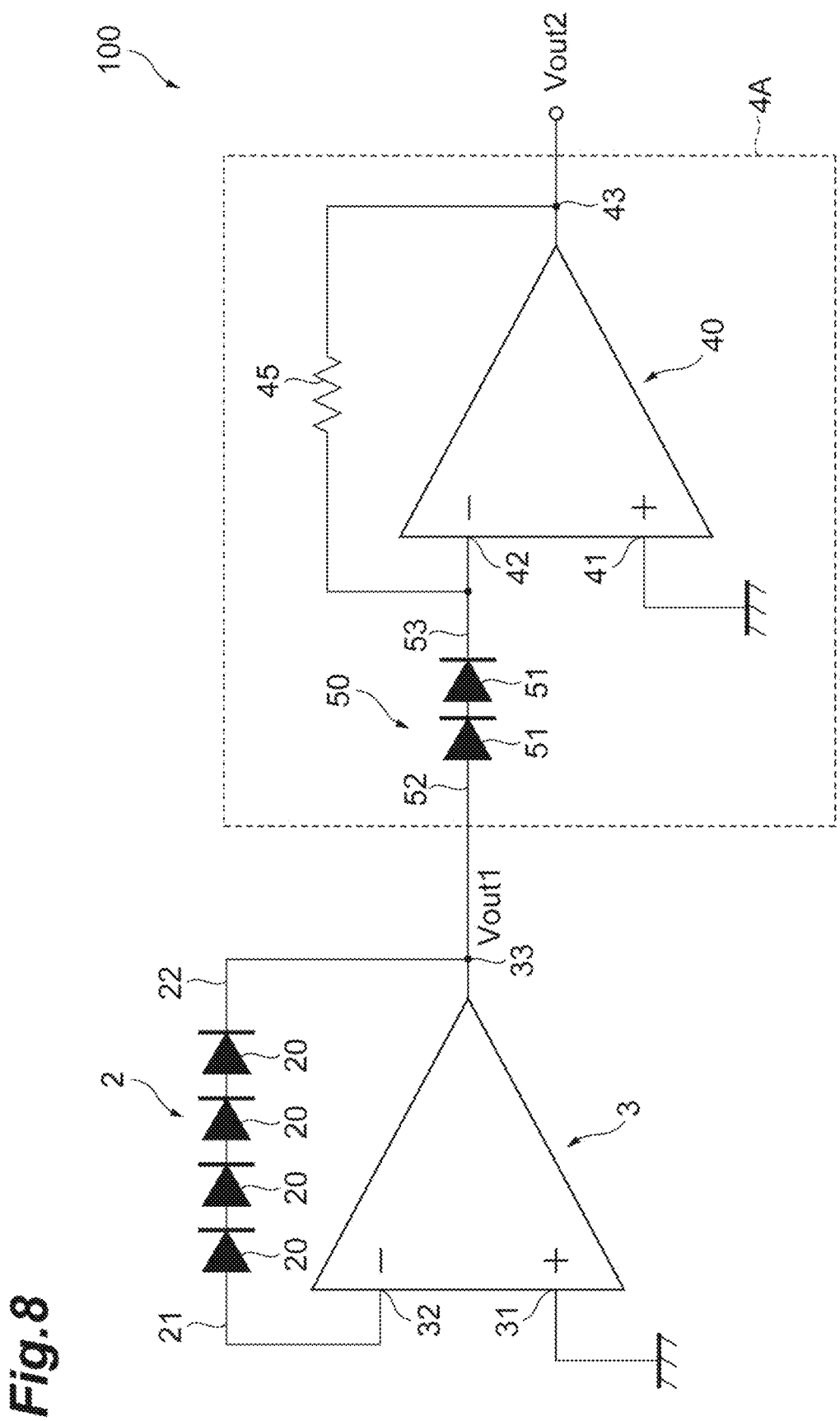
FIG. 8 is a diagram illustrating the configuration of an optical detection circuit according to a third embodiment.

Next, an optical detection circuit according to a third embodiment will be described with FIG. 8. FIG. 8 is a diagram illustrating the configuration of the optical detection circuit according to the third embodiment. As illustrated in FIG. 8, an optical detection circuit 100 according to the third embodiment is different from the optical detection circuit 10 according to the second embodiment in that an inverting amplifier circuit 4A is provided instead of the inverting amplifier circuit 4. The inverting amplifier circuit 4A is different from the inverting amplifier circuit 4 in that an optical detection element 50 (second optical detection element) is provided instead of the resistive element 44. In FIG. 8, an anode 52 (second anode) of the optical detection element 50 is connected to the output terminal 33 and a cathode 53 (second cathode) of the optical detection element 50 is connected to the inverting input terminal 42.

The optical detection element 50 has a plurality of photodiodes 51 (plurality of second photodiodes) connected in series. For example, the optical detection element 50 includes two photodiodes 51. Each photodiode 51 is, for example, an InAsSb photodiode, and may be formed of the same material as the photodiode 20. The optical etection element 50 includes a parallel resistive component having a resistance value Rsh2. The parallel resistive component of the optical detection element 50 is a resistive component occurring between the anode 52 and the cathode 53. That is the parallel resistive component of the optical detection element 50 forms a resistive element (first resistive element) connected between the output terminal 33 of the operational amplifier 3 and the inverting input terminal 42 of the operational amplifier 40. Thus, because the amplification factor of the inverting amplifier circuit 4A is the ratio (R2/Rsh2) of the resistance value R2 to the resistance value Rsh2, the output voltage Vout2 acquired by amplifying the output voltage Vout1 −(R2/Rsh2) times is generated in the optical detection circuit 100. Note that, because the resistance value of the series resistive component of the photodiode 51 (optical detection element 50) is considerably smaller than the resistance value of the parallel resistive component of the photodiode 51 (optical detection element 50), the influence of the series resistive component is negligible.

Figure 9:
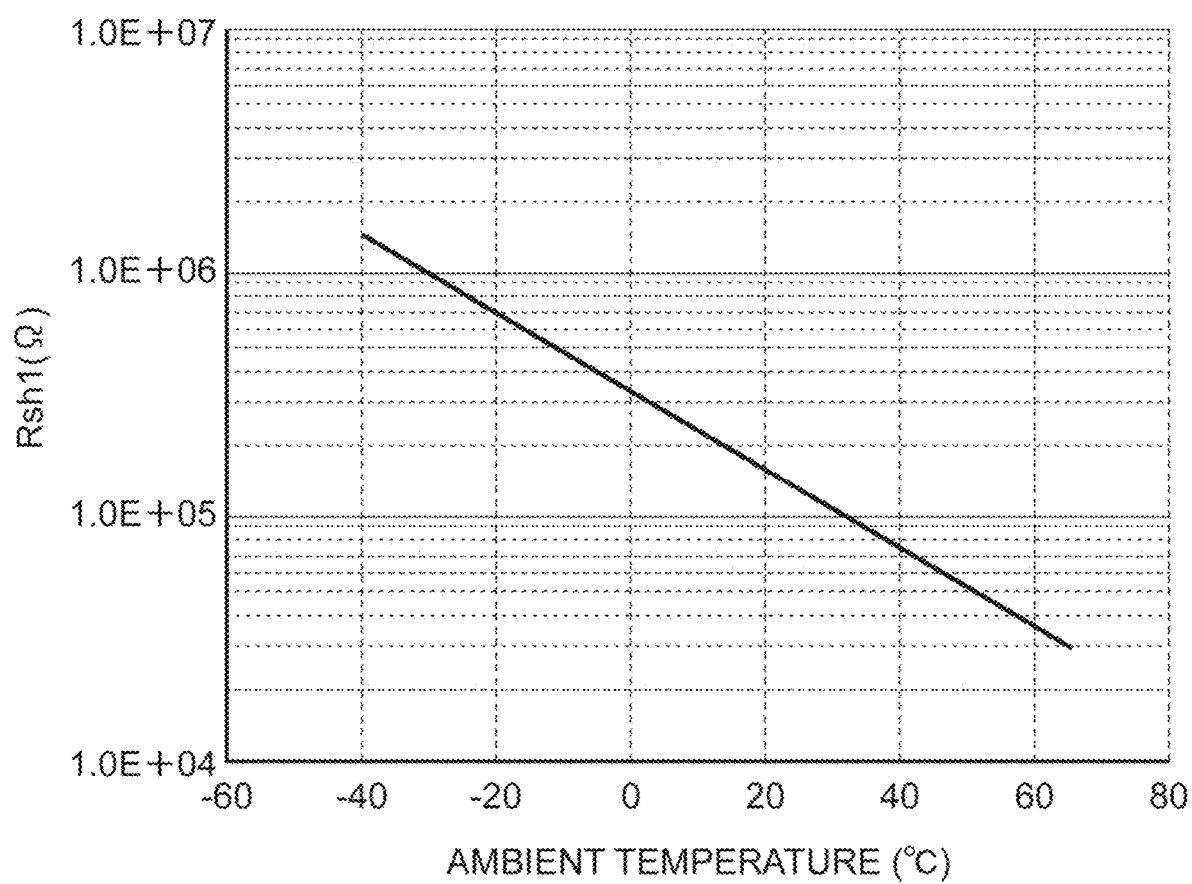
FIG. 9 is a graph illustrating an exemplary relationship between the ambient temperature and the parallel resistive component of an optical detection element.

FIG. 9 is a graph illustrating an exemplary relationship between the ambient temperature and the parallel resistive component of an optical detection element. FIG. 9 illustrates the relationship between the resistance value Rsh1 (Ω) of the parallel resistive component of the optical detection element 2 having 245 InAsSb photodiodes connected in series and the ambient temperature (° C.). As illustrated in FIG. 9, as the ambient temperature of the optical detection element 2 increases, the resistance value Rsh1 decreases. As the ambient temperature of the optical detection element 2 decreases, the resistance value Rsh1 increases. As above, the resistance value Rsh1 varies, depending on the ambient temperature of the optical detection element 2. Thus, even when the incident-light quantity is constant, the output voltage Vout1 is likely to vary.

In a case where the optical detection element 2 has n1 number of photodiodes 20 connected in series (n1 is an integer of two or more), when all the photocurrent Ip flows in the parallel resistive component of the optical detection element 2, the resistance value Rsh1 is n1×Rsh0. In a case where the optical detection element 50 has n2 number of photodiodes 51 connected in series (n2 is an integer of two or more), when the resistance value of the parallel resistive component included in the photodiode 51 is the same as the resistance value Rsh0 of the photodiode 20, the resistance value Rsh2 is n2×Rsh0. In this case, the output voltage Vout2 is obtained with the following Formula (1). Further arrangement of Formula (1) results in acquisition of the following Formula (2).

[Formula 1]
$$Vout2 = Ip \times n1 \times Rsh0 \times \frac{R2}{n2 \times Rsh0} \quad (1)$$

[Formula 2]
$$Vout2 = Ip \times \frac{n1}{n2} \times R2 \quad (2)$$

As indicated in Formula (2), when the resistance value of the parallel resistive component included in each photodiode 51 is the same as the resistance value Rsh0 of the photodiode 20 of the optical detection element 2, the output voltage Vout2 is not affected by the resistance value of each photodiode 51 and the resistance value of each photodiode 20. Thus, even when the resistance value Rsh0 (Rsh1) varies due to the ambient temperature, in a case where the incident-light quantity is constant, the output voltage Vout2 is substantially constant.

As an example, a calculated result of the output voltage Vout1 with the optical detection element 2 including 200 photodiodes 20 (n1=200) and the optical detection element 50 including two photodiodes 51 (n2=2), will be given. At an ambient temperature of 15° C., the resistance value Rsh1 is 200 kΩ (Rsh0 is 1 kΩ), and the resistance value Rsh2 is 2 kΩ. When the photocurrent Ip is 10 nA, the output voltage Vout1 is 2 mV. When the resistance value R2 is 10 kΩ, the amplification factor of the inverting amplifier circuit 4 is five, so that the output voltage Vout2 is 10 mV. Meanwhile, at an ambient temperature of 35° C., the resistance value Rsh1 is 100 kΩ(Rsh0 is 0.5 kΩ), and the resistance value Rsh2 is 1 kΩ. In this case, the output voltage Vout1 is 1 mV, and the amplification factor of the inverting amplifier circuit 4 is ten, so that the output voltage Vout2 is 10 mV. As above, in a case where variation is small in the respective characteristics of the resistive element 45 and the operational amplifiers 3 and 40 based on the ambient temperature, even when the ambient temperature varies, the output voltage Vout2 with the incident-light quantity that is constant, is substantially constant. Thus, temperature compensation can be performed with the optical detection element 50.

The optical detection element 50 may be formed on the same chip with the optical detection element 2 such that the temperature characteristic of the parallel resistive component of the optical detection element 2 is substantially the same as the temperature characteristic of the parallel resistive component of the optical detection element 50. Specifically, the PN junction of each photodiode 20 and the PN junction of each photodiode 51 are provided on the same semi-insulating substrate. In this case, three terminals for external connection, consisting of an electrode to which both the cathode 22 and the anode 52 are connected, the anode 21, and the cathode 53, may be provided on the semi-insulating substrate on which the optical detection element 2 and the optical detection element 50 are formed, with the cathode 22 and the anode 52 mutually connected on the semi-insulating substrate. The PN junction of each photodiode 20 and the PN junction of each photodiode 51 may have the same structure. Note that the optical detection element 50 may be light-shielded or the incident light may enter the optical detection element 50, similarly to the optical detection element 2.

In the optical detection circuit 100 having the configuration described above, the voltage generated between the anode 21 and the cathode 22 is substantially equal to the value acquired by multiplying the resistance value Rsh1 by the photocurrent Ip. As the ambient temperature of the optical detection circuit 1 rises, the resistance value Rsh1 decreases, resulting in decrease of the output voltage Vout1. Meanwhile, as the ambient temperature of the optical detection circuit 1 rises, the resistance value Rsh2 decreases, resulting in increase of the amplification factor of the inverting amplifier circuit 4. Thus, even when the output voltage Vout1 decreases on the basis of the ambient temperature, the amplification factor of the inverting amplifier circuit 4 increases, resulting in reduction (cancellation) of the influence of variation of the resistance value Rsh1 due to the ambient temperature. Similarly, as the ambient temperature of the optical detection circuit 1 drops, the resistance value Rsh1 increases, resulting in increase of the output voltage Vout1. Meanwhile, as the ambient temperature of the optical detection circuit 1 drops, the resistance value Rsh2 increases, resulting in decrease of the amplification factor of the inverting amplifier circuit 4. Thus, even when the output voltage Vout1 increases on the basis of the ambient temperature, the amplification factor of the inverting amplifier circuit 4 decreases, resulting in reduction (cancellation) of the influence of variation of the resistance value Rsh1 due to the ambient temperature. Therefore, the variation of the output voltage Vout2 based on the ambient temperature, can be reduced.

Because the optical detection element 50 is formed on the same chip with the optical detection element 2, the parallel resistive component of each photodiode 20 and the parallel resistive component of each photodiode 51 have the same resistance value Rsh0. Thus, the parallel resistive component of each photodiode 20 and the parallel resistive component of each photodiode 51 have substantially the same temperature characteristic. Therefore, as indicated in Formula (2), the output voltage Vout2 is not affected by the parallel resistive component of each photodiode 20 and the parallel resistive component of each photodiode 51, resulting in further reduction of the variation of the output voltage Vout2 based on the ambient temperature.

As indicated in Formula (2), the output voltage Vout2 is substantially proportional to the value (n1/n2) acquired by dividing the number of photodiodes 20, which is n1, by the number of photodiodes 51, which is n2. Accordingly, decreasing the number of photodiodes 51, which is n2, below the number of photodiodes 20, which is n1, enables output of the output voltage Vout2 having a high voltage value, with reduction of the variation of the output voltage Vout2 based on the ambient temperature.

The photocurrent Ip that the optical detection element 2 generates is determined by quantum efficiency, and thus the variation of the photocurrent Ip based on the individual difference between the optical detection elements 2 and 50, is small. The quantum efficiency is the value acquired by dividing the number of electrons or the number of holes generated in accordance with the incident-light quantity by the number of photons of incident light. Meanwhile, the resistance values Rsh1 and Rsh2 vary due to the individual difference between the optical detection elements 2 and 50. In a case where the optical detection element 2 and the optical detection element 50 are formed on the same chip, the resistance value of the parallel resistive component of each photodiode 20 and the resistance value of the parallel resistive component of each photodiode 51 have the same value (resistance value Rsh0). Thus, as indicated in Formula (2) above, the output voltage Vout2 is not affected by the influence of the parallel resistive component of each photodiode 20 and the influence of the parallel resistive component of each photodiode 51, resulting in reduction of the variation of the output voltage Vout2 based on the individual difference. Note that, in a case where the parallel resistive component of each photodiode 51 has a temperature characteristic in which the resistance value decreases along with increase of the ambient temperature and the resistance value increases along with decrease of the ambient temperature, similarly to that of each photodiode 20, the optical detection element 2 and the optical detection element 50 may be formed on respective different chips.

Figure 10:
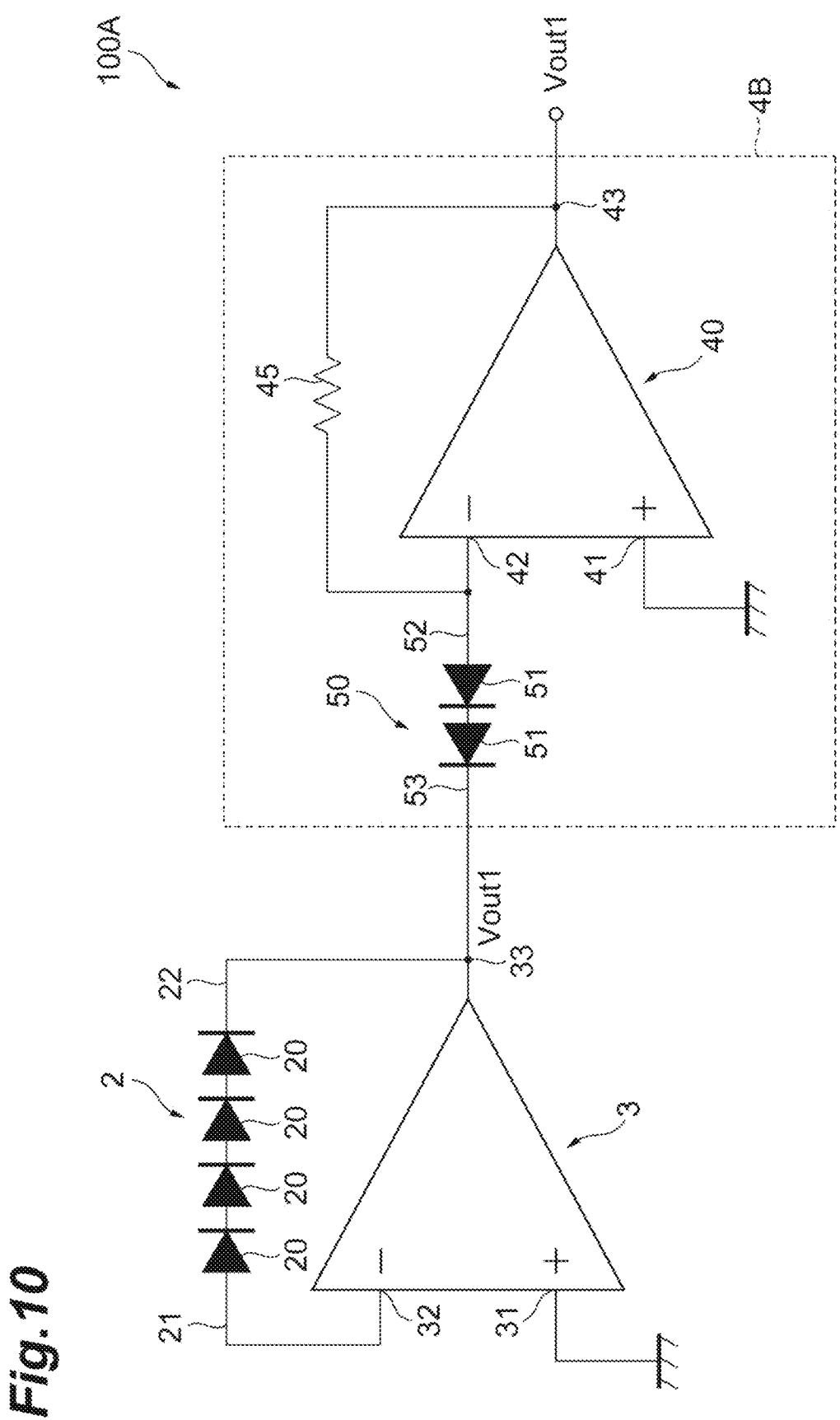
FIG. 10 is a diagram illustrating a first modification of the optical detection circuit according to the third embodiment.

FIG. 10 is a diagram illustrating a first modification of the optical detection circuit according to the third embodiment. As illustrated in FIG. 10, an optical detection circuit 100A is different from the optical detection circuit 100 illustrated in FIG. 8 in that an inverting amplifier circuit 4B is provided instead of the inverting amplifier circuit 4A. The inverting amplifier circuit 4B is different from the inverting amplifier circuit 4A in terms of the connection arrangement of the optical detection element 50. In the inverting amplifier circuit 4B, the cathode 53 is connected to the output terminal 33 and the anode 52 is connected to the inverting input terminal 42.

The optical detection circuit 100A has an effect similar to that of the optical detection circuit 100. That is, although the polarity of the optical detection element 50 in the optical detection circuit 100A is opposite to the polarity of the optical detection element 50 in the optical detection circuit 100, the optical detection circuit 100A has an effect similar to that of the optical detection circuit 100.

Figure 11:
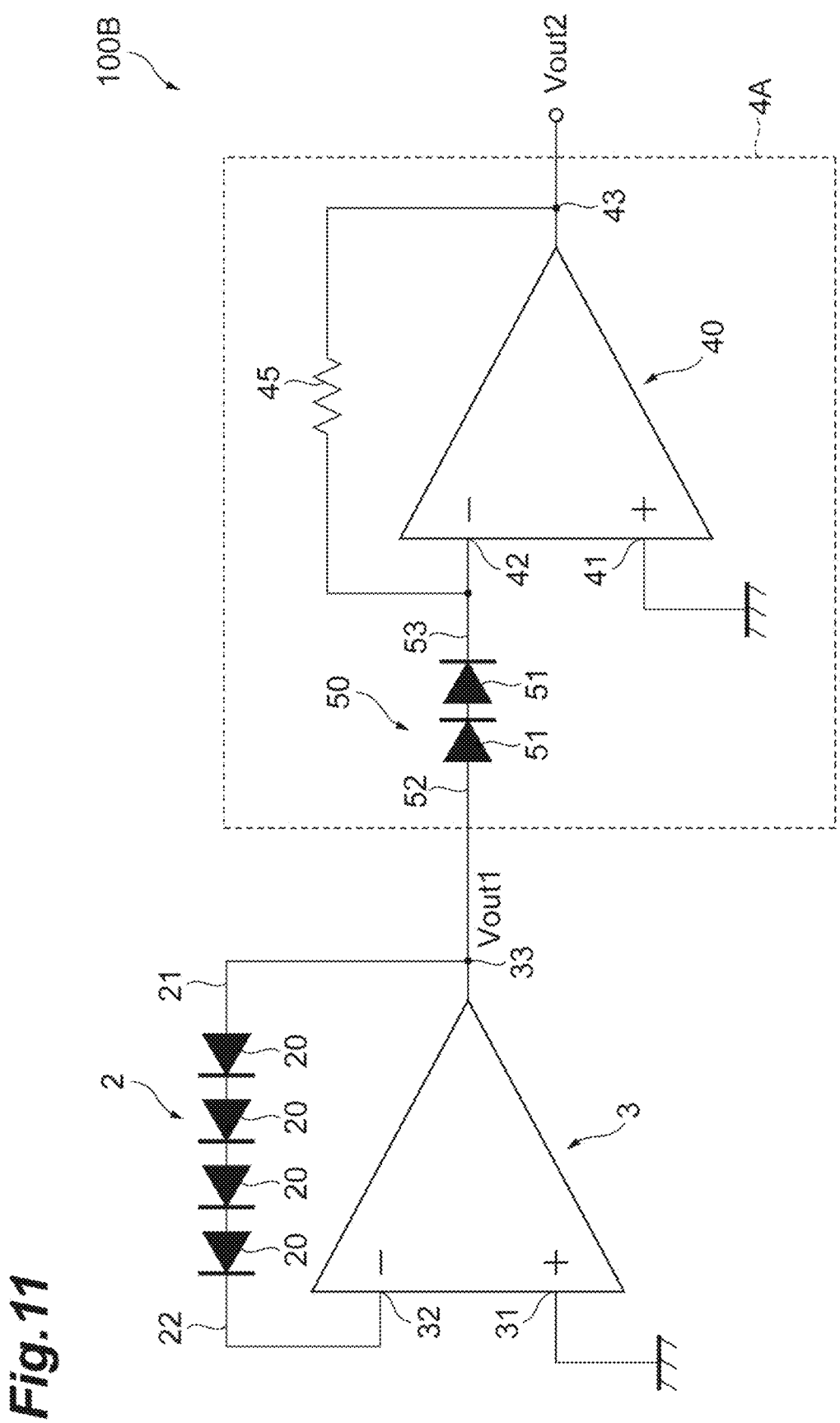
FIG. 11 is a diagram illustrating a second modification of the optical detection circuit according to the third embodiment.

FIG. 11 is a diagram illustrating a second modification of the optical detection circuit according to the third embodiment. As illustrated in FIG. 11, an optical detection circuit 100B is different from the optical detection circuit 100 illustrated in FIG. 8 in terms of the connection arrangement of the optical detection element 2. In the optical detection circuit 100B, the cathode 22 is connected to the inverting input terminal 32, and the anode 21 is connected to the output terminal 33.

The optical detection circuit 100B has an effect similar to that of the optical detection circuit 100. That is, although the polarity of the optical detection element 2 in the optical detection circuit 100B is opposite to the polarity of the optical detection element 2 in the optical detection circuit 100, the optical detection circuit 100B has an effect similar to that of the optical detection circuit 100.

Figure 12:
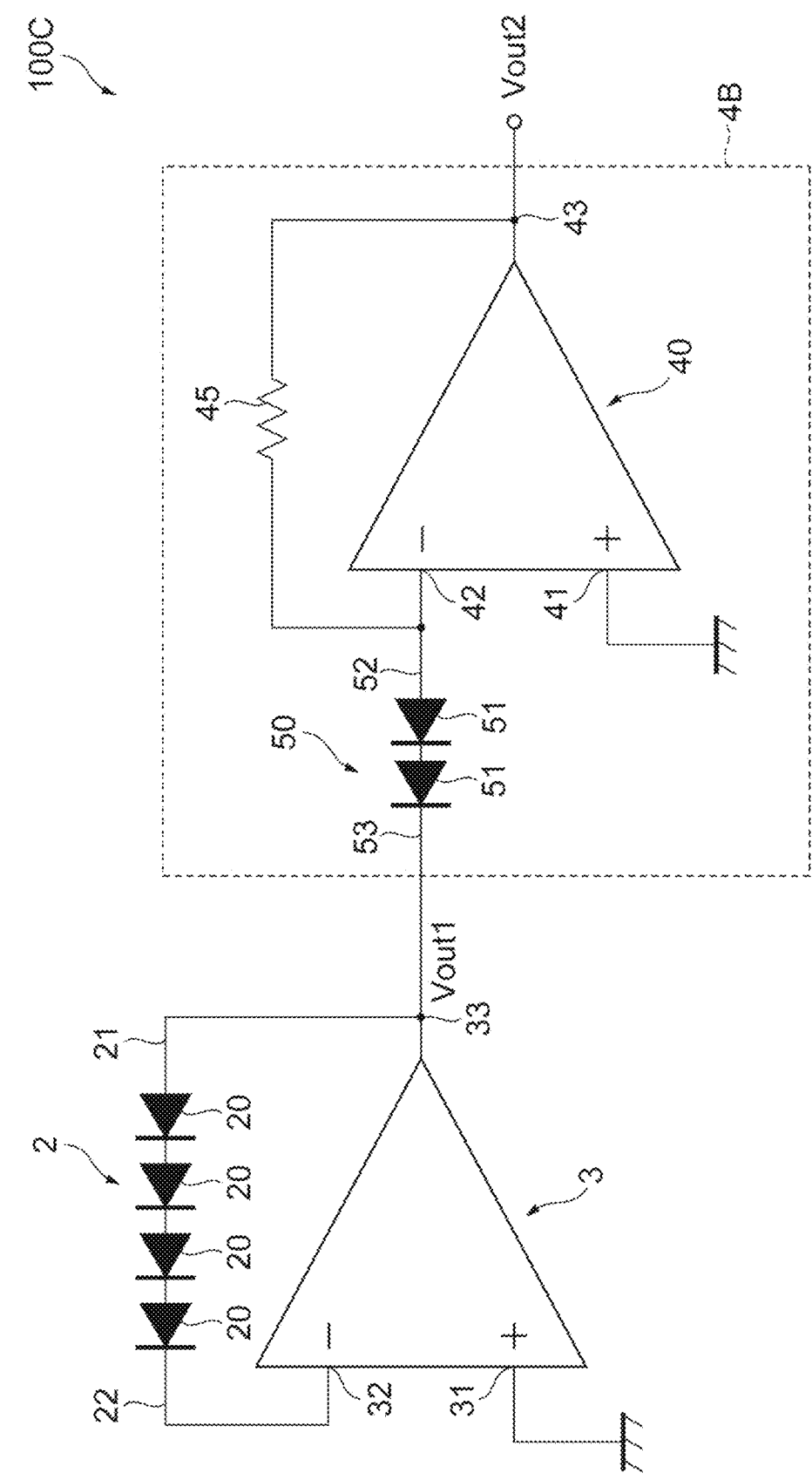
FIG. 12 is a diagram illustrating a third modification of the optical detection circuit according to the third embodiment.

FIG. 12 is a diagram illustrating a third modification of the optical detection circuit according to the third embodiment. As illustrated in FIG. 12, an optical detection circuit 100C is different from the optical detection circuit 100A illustrated in FIG. 10 in terminal of the connection arrangement of the optical detection element 2. In the optical detection circuit 100C, the cathode 22 is connected to the inverting input terminal 32, and the anode 21 is connected to the output terminal 33.

The optical detection circuit 100C has an effect similar to that of the optical detection circuit 100. That is, although the polarity of the optical detection element 50 and the polarity of the optical detection element 2 in the optical detection circuit 100C are opposite to the polarity of the optical detection element 50 and the polarity of the optical detection element 2 in the optical detection circuit 100 respectively, the optical detection circuit 100C has an effect similar to that of the optical detection circuit 100.

Note that the second modification or third modification of the first embodiment or a combination thereof may be applied to the optical detection circuits 100, 100A, 100B, and 100C according to the third embodiment.

In the first to third embodiments described above, in a case where the parallel resistive component of the optical detection element 2 has the resistance value Rsh1 enabling the operation of the operational amplifier 3, the PN junction of each photodiode 20 may be fainted with a semiconductor material different from InAsSb. For example, the PN junction of each photodiode 20 may be formed with silicon (Si) or germanium (Ge), which is a single-element semiconductor. The PN junction of each photodiode 20 may be formed with indium gallium arsenide (InGaAs), gallium arsenide (GaAs), gallium aluminum arsenide (GaAlAs), or indium phosphide (InP), which is a compound semiconductor. The PN junction of each photodiode 51 may be formed with a semiconductor material different from that of the PN junction of each photodiode 20.

The number of photodiodes 20 included in the optical detection element 2 may be one (n1=1). The number of photodiodes 51 included in the optical detection element 50 may be one (n2=1). The number of photodiodes 51, which is n2, may be not less than the number of photodiodes 20, which is n1.

Each photodiode 20 and each photodiode 51 may be a PIN-type photodiode having a PIN junction.

As a circuit that amplifies the output voltage Vout1, an amplifier circuit different from the inverting amplifier circuit 4 and the non-inverting amplifier circuit, may be used. The circuit that amplifies the output voltage Vout1, does not necessarily include the operational amplifier 40.

REFERENCE SIGNS LIST

1, 1A, 1B, 1C, 10, 100, 100A, 100B, 100C optical detection circuit
2 optical detection element
21 anode
22 cathode
3 operational amplifier
4, 4A, 4B inverting amplifier circuit
50 optical detection element

The invention claimed is:

1. An optical detection circuit comprising:
  a first optical detector having a first anode and a first cathode, the first optical detector being configured to generate voltage between the first anode and the first cathode due to photoelectromotive force generated in accordance with incident-light quantity; and
  a first operational amplifier having a first non-inverting input terminal, a first inverting input terminal, and a first output terminal, wherein
  the first non-inverting input terminal is connected to fixed potential, and
  one of the first anode and the first cathode is connected to the first inverting input terminal, and another of the first anode and the first cathode is connected to the first output terminal.

2. The optical detection circuit according to claim 1, further comprising an amplifier circuit configured to amplify output voltage occurring at the first output terminal.

3. The optical detection circuit according to claim 2, wherein
  the amplifier circuit has a second operational amplifier, a first resistor, and a second resistor,
  the second operational amplifier has a second non-inverting input terminal, a second inverting input terminal, and a second output terminal,
  one end of the first resistor is connected to the second inverting input terminal, and another end of the first resistor is connected to the first output terminal,
  one end of the second resistor is connected to the second inverting input terminal, and another end of the second resistor is connected to the second output terminal, and
  the second non-inverting input terminal is connected to fixed potential.

4. The optical detection circuit according to claim 3, wherein
  the first resistor is a second optical detector having a second anode and a second cathode, and
  the second optical detector generates voltage between the second anode and the second cathode due to photoelectromotive force generated in accordance with incident-light quantity.

5. The optical detection circuit according to claim 4, wherein
  the second optical detector is formed on a chip on which the first optical detector is formed.

6. The optical detection circuit according to claim 4, wherein
  the first optical detector includes a single first photodiode or a plurality of first photodiodes connected in series, and
  the second optical detector includes a single second photodiode or a plurality of second photodiodes connected in series.

7. The optical detection circuit according to claim 6, wherein
  a number of the second photodiodes is smaller than a number of the first photodiodes.

8. The optical detection circuit according to claim 1, wherein the first anode is connected to the first inverting input terminal, and the first cathode is connected to the first output terminal.

9. The optical detection circuit according to claim 1, wherein the first cathode is connected to the first inverting input terminal, and the first anode is connected to the first output terminal.

10. The optical detection circuit according to claim 1, further comprising a capacitor, wherein one end of the capacitor is connected to the first anode, and another end of the capacitive element is connected to the first cathode.

11. The optical detection circuit according to claim 1, further comprising a third resistive element, wherein one end of the third resistor is connected to the first anode, and another end of the third resistor is connected to the first cathode.

\* \* \* \* \*